United States Patent
Wang et al.

(10) Patent No.: US 10,763,872 B1
(45) Date of Patent: Sep. 1, 2020

(54) FREQUENCY-CONVERTED SELF-INJECTION-LOCKED RADAR

(71) Applicant: Sil Radar Technology Inc., Kaohsiung (TW)

(72) Inventors: Fu-Kang Wang, Kaohsiung (TW); Pin-Hsun Juan, Kaohsiung (TW); Sheng-You Tian, Kaohsiung (TW)

(73) Assignee: Sil Radar Technology Inc., Kaohsiung (TW)

( * ) Notice: Subject to any disclaimer, the term of this patent is extended or adjusted under 35 U.S.C. 154(b) by 0 days.

(21) Appl. No.: 16/456,072

(22) Filed: Jun. 28, 2019

(30) Foreign Application Priority Data

Mar. 15, 2019 (TW) .............................. 108109002 A

(51) Int. Cl.
| | |
|---|---|
| *H03L 7/24* | (2006.01) |
| *H03D 3/00* | (2006.01) |
| *H04L 27/22* | (2006.01) |
| *H01Q 3/42* | (2006.01) |
| *G01S 13/32* | (2006.01) |
| *G01S 13/88* | (2006.01) |
| *G01S 13/58* | (2006.01) |
| *H04L 27/38* | (2006.01) |

(52) U.S. Cl.
CPC ............... *H03L 7/24* (2013.01); *G01S 13/32* (2013.01); *G01S 13/583* (2013.01); *G01S 13/88* (2013.01); *H01Q 3/42* (2013.01); *H03D 3/007* (2013.01); *H04L 27/22* (2013.01); *H04L 27/389* (2013.01)

(58) Field of Classification Search
CPC . H03L 7/24; H04L 27/22; H04L 7/389; H04L 27/2272; H04L 27/14; H04L 27/227; H03D 3/007; G01S 13/767; G01S 13/583; G01S 13/88; H01Q 3/42
See application file for complete search history.

(56) References Cited

U.S. PATENT DOCUMENTS

| | | | |
|---|---|---|---|
| 6,339,711 B1 * | 1/2002 | Otaka | ................... H03D 3/008 455/13.4 |
| 7,483,687 B2 * | 1/2009 | Carrez | ................. H03D 7/1441 455/318 |
| 9,375,153 B2 | 6/2016 | Horng et al. | |
| 9,423,496 B2 * | 8/2016 | Horng | ..................... G01S 13/08 |
| 9,603,555 B2 * | 3/2017 | Horng | .................... A61B 5/113 |
| 9,673,829 B1 | 6/2017 | Xu et al. | |
| 2012/0122416 A1 | 5/2012 | Ito | |

(Continued)

FOREIGN PATENT DOCUMENTS

TW    I634344    9/2018

OTHER PUBLICATIONS

Taiwanese Office Action dated May 15, 2019 for Taiwanese Patent Application No. 108109002, 4 pages.

(Continued)

*Primary Examiner* — Khanh C Tran

(74) *Attorney, Agent, or Firm* — Jackson IPG PLLC; Demian K. Jackson

(57) ABSTRACT

By changing frequencies of an oscillation signal and an injection signal, a frequency-converted self-injection-locked radar has an oscillation frequency different to a frequency of a transmitted signal from a transceiver antenna element such that the frequency-converted self-injection-locked radar with high sensitivity and penetration or with high sensitivity d low cost is achieved.

11 Claims, 5 Drawing Sheets

(56) References Cited

U.S. PATENT DOCUMENTS

| | | |
|---|---|---|
| 2012/0319746 A1 | 12/2012 | Hayashi et al. |
| 2013/0234729 A1* | 9/2013 | Jau .................... G08B 13/2491 |
| | | 324/642 |
| 2013/0321198 A1 | 12/2013 | Park et al. |
| 2014/0128748 A1* | 5/2014 | Horng ............... G08B 13/2491 |
| | | 600/484 |
| 2014/0266893 A1 | 9/2014 | Rasheed et al. |
| 2018/0083358 A1 | 3/2018 | Wang et al. |
| 2018/0176054 A1 | 6/2018 | Kawasaki |
| 2018/0224526 A1 | 8/2018 | Wang et al. |
| 2018/0338730 A1* | 11/2018 | Horng .................. G01S 13/003 |
| 2019/0377080 A1* | 12/2019 | Wang .................. H01Q 15/244 |

OTHER PUBLICATIONS

Zhengyu Peng et al., A Portable 24-GHz FMCW Radar based on Six-Port for Short-Range Human Tracking, 2015 IEEE MTT-S 2015 International Microwave Workshop Series on RF and Wireless Technologies for Biomedical and Healthcare Applications (IMWS-BIO), Sep. 23, 2015.

Ming-Chun Lin, Vital Sign Detection Using Active Antennas, Master Thesis of National Sun Yat-sen University, Jul. 30, 2012.

R.A. York et al., Injection- and Phase-Locking Techniques for Beam Control, IEEE Transactions on Microwave Theory and Techniques (vol. 46 , Issue: 11 , Nov. 1998 ).

\* cited by examiner

US 10,763,872 B1

FREQUENCY-CONVERTED SELF-INJECTION-LOCKED RADAR

FIELD OF THE INVENTION

This invention generally relates to a self-injection-locked (SIL) radar, and more particularly to a frequency-converted SIL radar.

BACKGROUND OF THE INVENTION

Conventional SIL radar includes a self-injection-locked oscillator (SILO) and an antenna. An oscillation signal generated from the SILO is transmitted from the antenna to an object as a transmitted signal and reflected from the object to the SILO as a reflected signal. The reflected signal received as an injection signal by the antenna is injected into the SILO such that the SILO is locked at a self-injection-locked state to generate a self-injection-locked signal. If the object has a motion relative to the antenna, the transmitted signal generates the Doppler Effect to lead the reflected signal and the injection signal contain phase shifts caused by the relative motion. After the injection signal injects into the SILO, the self-injection-locked signal outputted from the SILO also contains the motion information. Accordingly, the vibration frequency of the relative motion can be detected by demodulating the self-injection-locked signal. Because of non-contact detection of the object movement with high sensitivity, the conventional SILO has been widely used in vital sign measurement.

The sensitivity of the SIL radar is positively related to the center frequency level of the SILO, that is to say, the higher the center frequency of the SILO, the higher sensitivity the SIL radar has. However when increasing the center frequency of the SILO, the propagation loss of the transmitted signal from the antenna and the reflected signal from the object are raised and the available detection area is narrowed. Consequently, the conventional SIL radar having high sensitivity and penetration is difficult to realize.

SUMMARY

The object of the present invention is to convert center frequencies of oscillation signal outputted from SILO and injection signal by using frequency converter. The converted oscillation signal has a center frequency different to that of a transmitted signal, and the converted injection signal has a center frequency same as that of the SILO so that the SILO is injection-locked by the injection signal. For this reason, a SIL radar of the present invention has both high sensitivity and penetration.

A frequency-converted SIL radar of the present invention includes a self-injection-locked oscillator (SILO), a frequency converter, a transceiver antenna element and a demodulator. The frequency converter is electrically connected to the SILO, the transceiver antenna element is electrically connected to the frequency converter, and the demodulator is electrically connected to the SILO. The SILO generates an oscillation signal. The frequency converter receives the oscillation signal and converts a center frequency of the oscillation signal. The transceiver antenna element receives the converted oscillation signal, transmits the converted oscillation signal as a transmitted signal to an object and receives a reflected signal as an injection signal from the object. The frequency converter receives the injection signal and converts a center frequency of the injection signal. The converted injection signal injects into the SILO to lock the SILO in a self-injection-locked state. The demodulator receives and demodulates the oscillation signal.

The center frequencies of the oscillation signal and the injection signal are changed by the frequency converter such that the SILO has an oscillation frequency different to that of the transmitted signal and is injection-locked by the injection signal. Consequently, the frequency-converted SIL radar of the present invention has both high sensitivity and penetration, or has both high sensitivity and low cost.

DETAILED DESCRIPTION OF THE INVENTION

Figure 1:
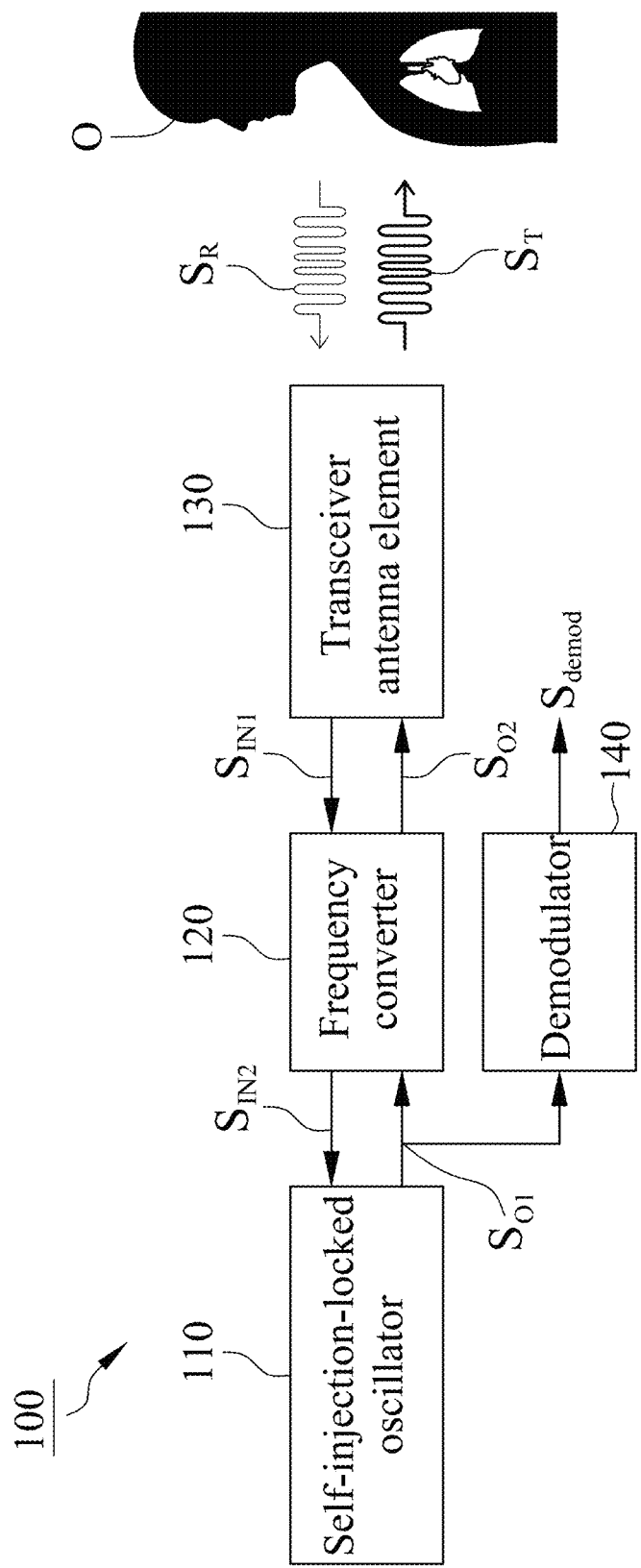
FIG. 1 is a block diagram illustrating a frequency-converted SIL radar in accordance with one embodiment of the present invention.

With reference to FIG. 1, a frequency-converted SIL radar 100 of one embodiment of the present invention includes a self-injection-locked oscillator (SILO) 110, a frequency converter 120, a transceiver antenna element 130 and a demodulator 140. The frequency converter 120 and the demodulator 140 are electrically connected to the SILO 110, and the transceiver antenna element 130 is electrically connected to the frequency converter 120.

The SILO 110 is configured to generate a first oscillation signal $S_{O1}$ which has a center frequency controlled by a voltage (not shown) received by the SILO 110. The frequency converter 120 receives the first oscillation signal $S_{O1}$ from the SILO 110 and converts its center frequency to output a second oscillation signal $S_{O2}$. The frequency converter 120 can either up or down convert the center frequency of the first oscillation signal $S_{O1}$ to the second oscillation signal $S_{O2}$.

The transceiver antenna element 130 receives the second oscillation signal $S_{O2}$ from the frequency converter 120, transmits the second oscillation signal $S_{O2}$ as a transmitted signal $S_T$ toward an object O and receives a reflected signal $S_R$ as a first injection signal $S_{IN1}$ from the object O. The first injection signal $S_{IN1}$ is delivered to the frequency converter 120. The Doppler Effect may be observed in the transmitted signal $S_T$ when there is a motion of the object O relative to the transceiver antenna element 130, consequently, the reflected signal $S_R$ and the first injection signal $S_{IN1}$ contain the Doppler shift components caused by the relative movement.

The frequency converter 120 receives the first injection signal $S_{IN1}$ and changes a center frequency of the first injection signal $S_{IN1}$ to output a second injection signal $S_{IN2}$ which also contains the Doppler shift components caused by the relative movement. The center frequency of the first injection signal $S_{IN1}$ may be up or down converted to the second injection signal $S_{IN2}$ by the frequency converter 120. The frequency converter 120 is configured to convert the first oscillation signal $S_{O1}$ and the first injection signal $S_{IN1}$ reversely so that the center frequency of the second injection signal $S_{IN2}$ is similar to the oscillating frequency of the SILO 110 The center frequency of the first injection signal $S_{IN1}$ is down when that of the first oscillation signal $S_{O1}$ is up. On the contrary, the center frequency of the first injection signal $S_{IN1}$ is up when that of the first oscillation signal $S_{O1}$ is down. If the second injection signal $S_{IN2}$ converted by the frequency converter 120 injects into the SILO 110, the SILO 110 is locked in a self-injection-locked state and a frequency variation of the first oscillation signal $S_{O1}$ from the locked SILO 110 is observed due to the second injection signal $S_{IN2}$ contains the Doppler shift components. The demodulator 140 receives and demodulates the first oscillation signal $S_{O1}$ so as to measure the vibration frequency of the moving object O relative to the transceiver antenna element 130.

Figure 2:
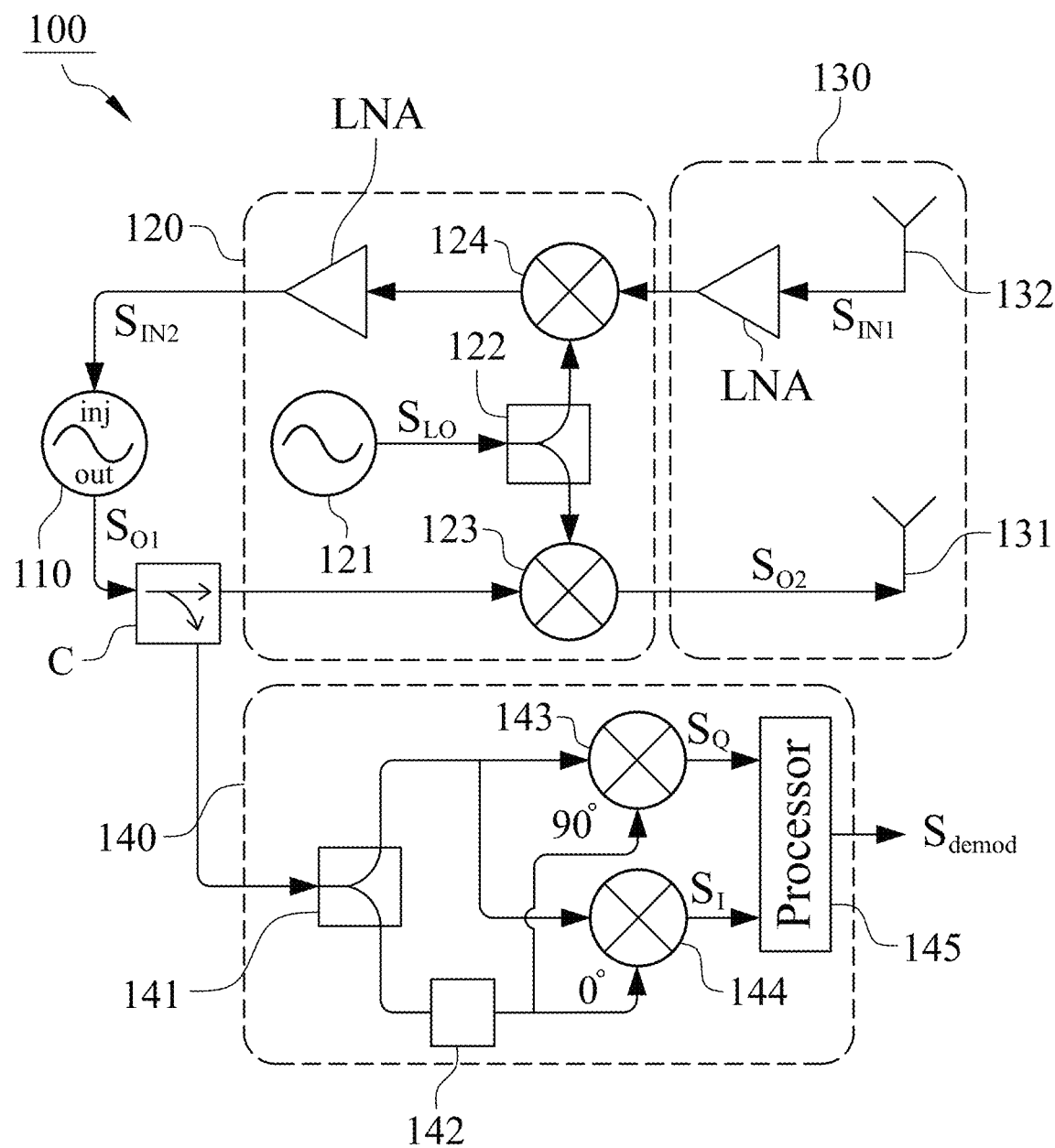
FIG. 2 is a circuit diagram illustrating a frequency-converted SIL radar in accordance with a first embodiment of the present invention.

FIG. 2 is a circuit diagram showing a first embodiment of the present invention, and the frequency converter 120 of the first embodiment is provided to down the center frequency of the first oscillation signal $S_{O1}$ and up the center frequency of the first injection signal $S_{IN1}$. In the first embodiment, the SILO 110 is a voltage-controlled oscillator adapted to output the first oscillation signal $S_{O1}$ having a center frequency of 5.8 GHz. The first oscillation signal $S_{O1}$ is divided into two signals by a coupler C, the two signals are delivered to the frequency converter 120 and the demodulator 140, respectively. The frequency converter 120 of the first embodiment includes a local oscillator 121, a power splitter 122, a down mixer 123 and an up mixer 124. The local oscillator 121 is configured to generate a local oscillation signal $S_{LO}$ having a frequency of 4.885 GHz. The power splitter 122 is electrically connected to the local oscillator 121 and configured to receive and divide the local oscillation signal $S_{LO}$ into two signals. The down mixer 123 is electrically connected to the local oscillator 121 via the power splitter 122 and electrically connected to the SILO 110 via the coupler C. The down mixer 123 receives the local oscillation signal $S_{LO}$ from the power splitter 122 and receive the first oscillation signal $S_{O1}$ from the coupler C, and further, the down mixer 123 mixes the local oscillation signal $S_{LO}$ and the first oscillation signal $S_{O1}$ to down-convert the center frequency of the first oscillation signal $S_{O1}$. The second oscillation signal $S_{O2}$ converted from the first oscillation signal $S_{O1}$ has a center frequency of 0.915 GHz.

The second oscillation signal $S_{O2}$ from the frequency converter 120 is received and transmitted as the transmitted signal $S_T$ by a transmitting antenna 131 of the transceiver antenna element 130, and the reflected signal $S_R$ from the object O is received as the first injection signal $S_{IN1}$ by a receiving antenna 132 of the transceiver antenna element 130. The transmitted signal $S_T$, the reflected signal $S_R$ and the first injection signal $S_{IN1}$ are all centered in 0.915 GHz with lower wireless propagation loss and better penetration because of the second oscillation signal $S_{O2}$, having a center frequency of 0.915 GHz. The up mixer 124 is electrically connected to the local oscillator 121 via the power splitter 122 and electrically connected to the receiving antenna 132 via a low-noise amplifier LNA. such that the up mixer 124 can receive the local oscillation signal $S_{LO}$ from the power splitter 122 and receive the first injection signal $S_{IN1}$ from the low-noise amplifier LNA which is provided to amplify the first injection signal $S_{IN1}$. The first injection signal $S_{IN1}$ is mixed with the local oscillation signal $S_{LO}$ by the up mixer 124 to increase center frequency so that the second injection signal $S_{IN2}$ has a center frequency of 5.8 GHz, similar to the oscillating frequency of the SILO 110, and is able to injection-lock the SILO 110.

Figure 3:
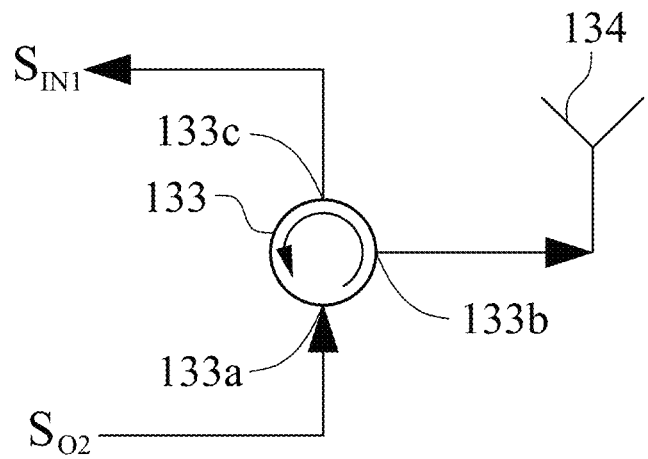
FIG. 3 is a circuit diagram illustrating a transceiver antenna element in accordance with one embodiment of the present invention.

With reference to FIG. 3, the transceiver antenna element 130 may be a single antenna system having a circulator 133 and a transceiver antenna 134. The second oscillation signal $S_{O2}$ can be delivered to a first port 133a of the circulator 133, outputted to the transceiver antenna 134 from a second port 133b of the circulator 133, and transmitted as the transmitted signal $S_T$ from the transceiver antenna 134. The reflected signal $S_R$ is received as the first injection signal $S_{IN1}$ by the transceiver antenna 134, and the first injection signal $S_{IN1}$ is delivered to the second port 133b of the circulator 133 and outputted from a third port 133c of the circulator 133 to the low-noise amplifier LNA.

With reference to FIG. 2, the center frequencies of the first oscillation signal $S_{O1}$ and the second oscillation signal $S_{O2}$ are, but not limited to, 5.8 GHz and 0.915 GHz, respectively. The SILO 110 operating at 5.8 GHz has a good sensitivity to the Doppler shift components caused by tiny movements, and the transmitted signal $S_T$ and the reflected signal $S_R$ centered in the 0.915 GHz by the frequency converter 120 have better penetration. Because of the frequency conversion of the frequency converter 120, the frequency-converted SIL radar 100 of the first embodiment has both high sensitivity and penetration.

With reference to FIG. 2, the demodulator 140 of the first embodiment is a frequency demodulator including a power splitter 141, a delay line 142, a first mixer 143, a second mixer 144 and a processor 145. The power splitter 141 is electrically connected to the SILO 110 via the coupler C, the delay line 142 is electrically connected to the power splitter 141, the first mixer 143 and the second mixer 144 are electrically connected to the power splitter 141 and the delay line 142, and the processor 145 is electrically connected to the first mixer 143 and the second mixer 144. The power splitter 141 receives the first oscillation signal $S_{O1}$ from the coupler C and divide the first oscillation signal $S_{O1}$ into two paths. The first oscillation signal $S_{O1}$ in one path is delivered to the first mixer 143 and the second mixer 144 directly, and the first oscillation signal $S_{O1}$ in the other path is delivered to the first mixer 143 and the second mixer 144 as a quadrature signal 90° and an in-phase signal 0°, respectively, via the delay line 142 and a quadrature power splitter (not shown). The first mixer 143 and the second mixer 144 mix the signals to output a first mixing signal $S_Q$ and a second mixing signal $S_I$, respectively. The processor 145 receives and processes the first mixing signal $S_Q$ and the second mixing signal $S_I$ to output a demodulated signal $S_{demod}$.

Figure 4:
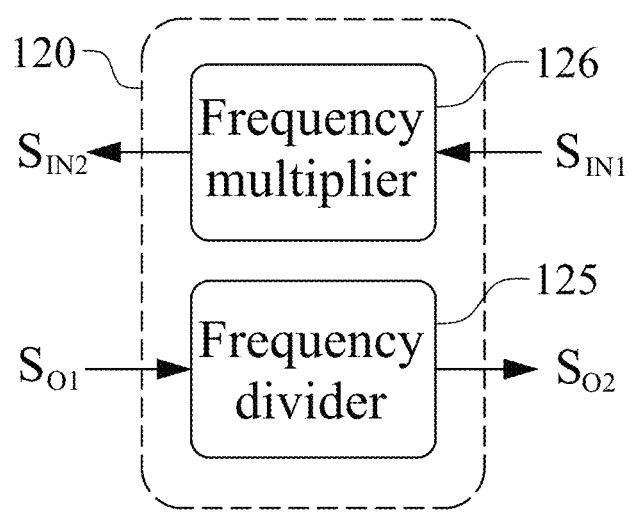
FIG. 4 is a circuit diagram illustrating a frequency-converted SIL radar in accordance with a second embodiment of the present invention.

FIG. 4 represents the frequency converter 120 of a second embodiment of the present invention. The frequency converter 120 in the second embodiment utilizes a frequency divider 125 and a frequency multiplier 126 to down-convert the center frequency of the first oscillation signal $S_{O1}$ and up-convert the center frequency of the first injection signal $S_{IN1}$. The frequency divider 125 is electrically connected to the SILO 110 for receiving the first oscillation signal $S_{O1}$ and is provided to divide the center frequency of the first oscillation signal $S_{O1}$ by a constant N to down-convert the first oscillation signal $S_{O1}$ to the second oscillation signal $S_{O2}$. The frequency multiplier 126 is electrically connected to the transceiver antenna element 130 to receive the first injection signal $S_{IN1}$ and provided to multiply the center frequency of the first injection signal $S_{IN1}$ by the constant N to up-convert the first injection signal $S_{IN1}$ into the second injection signal $S_{IN2}$. The frequency converter 120 of the second embodiment is utilized to change the center frequencies of the first oscillation signal $S_{O1}$ and the first injection signal $S_{IN1}$ such that the SILO 110 can operate at high frequency and the transmitted signal $S_T$ can be transmitted at low frequency. As a result, the frequency-converted SIL radar 100 of the second embodiment is capable of achieving balance between sensitivity and penetration.

Figure 5:
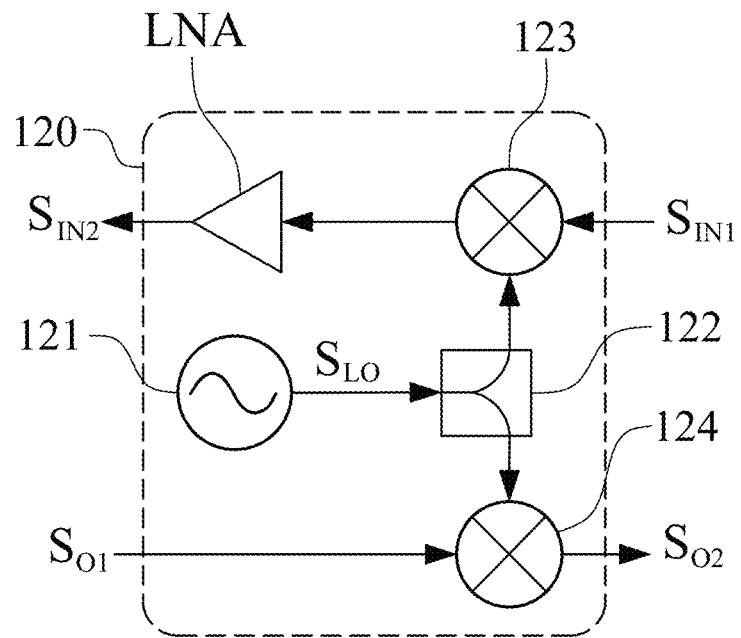
FIG. 5 is a circuit diagram illustrating a frequency-converted SIL radar in accordance with a third embodiment of the present invention.

With reference to FIG. 5, different to the first embodiment, the frequency converter 120 of a third embodiment is provided to up-convert the center frequency of the first oscillation signal $S_{O1}$ and down-convert the center frequency of the first injection signal $S_{IN1}$. In the third embodiment, the up mixer 124 of the frequency converter 120 is electrically connected to the local oscillator 121 and the SILO 110 in order to receive the local oscillation signal $S_{LO}$ from the local oscillator 121 and receive the first oscillation signal $S_{O1}$ from the SILO 110. The first oscillation signal $S_{O1}$ is mixed with the local oscillation signal $S_{LO}$ by the up mixer 124 to increase center frequency so that the first oscillation signal $S_{O1}$ is converted into the second oscillation signal $S_{O2}$. The second oscillation signal $S_{O2}$ is delivered to the transceiver antenna element 130 and transmitted as the transmitted signal $S_T$. The down mixer 123 of the frequency converter 120 is electrically connected to the local oscillator 121 and the transceiver antenna element 130 for receiving the local oscillation signal $S_{LO}$ from the local oscillator 121 and receiving the first injection signal $S_{IN1}$ from the transceiver antenna element 130. And the down mixer 123 mixes the local oscillation signal $S_{LO}$ and the first injection signal $S_{IN1}$ to decrease the center frequency of the first injection signal $S_{IN1}$, as a result, the first injection signal $S_{IN1}$ is converted to the second injection signal $S_{IN2}$. The center frequency of the transmitted signal $S_T$ from the transceiver antenna element 130 is higher than the oscillating frequency of the SILO 110 so the frequency-converted SIL radar 100 of the third embodiment is highly sensitive to tiny movements and able to reduce size because of the transmitted signal $S_T$ having high frequency. Besides, the SILO 110 operating at low frequency also can simplify the architecture.

Figure 6:
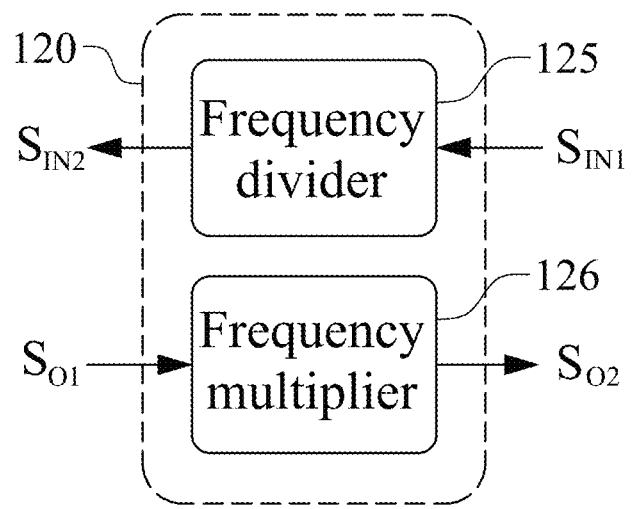
FIG. 6 is a circuit diagram illustrating a frequency-converted SIL radar in accordance with a fourth embodiment of the present invention.

With reference to FIG. 6, the frequency converter 120 of a fourth embodiment is designed to up-convert the center frequency of the first oscillation signal $S_{O1}$ and down-convert the center frequency of the first injection signal $S_{IN1}$. Different to the third embodiment, the frequency converter 120 utilizes a frequency divider 125 and a frequency multiplier 126 to convert frequency in the fourth embodiment. The frequency multiplier 126 is electrically connected to the SILO 110 and configured to receive the first oscillation signal $S_{O1}$ and multiply the center frequency of the first oscillation signal $S_{O1}$ by a constant N such that the first oscillation signal $S_{O1}$ is up-converted into the second oscillation signal $S_{O2}$. The frequency divider 125 is electrically connected to the transceiver antenna element 130 and configured to receive the first injection signal $S_{IN1}$ and divide the center frequency of the first injection signal $S_{IN1}$ by the constant N to down-convert the first injection signal $S_{IN1}$ into the second injection signal $S_{IN2}$. Similarly, the center frequencies of the first oscillation signal $S_{O1}$ and the first injection signal $S_{IN1}$ are changed by the frequency converter 120 to allow the SILO 110 to operate at low frequency and allow the transmitted signal $S_T$ to be transmitted at high frequency. Hence, the frequency-converted SIL radar 100 of the fourth embodiment has advantages of high sensitivity and low manufacturing cost.

Figure 7:
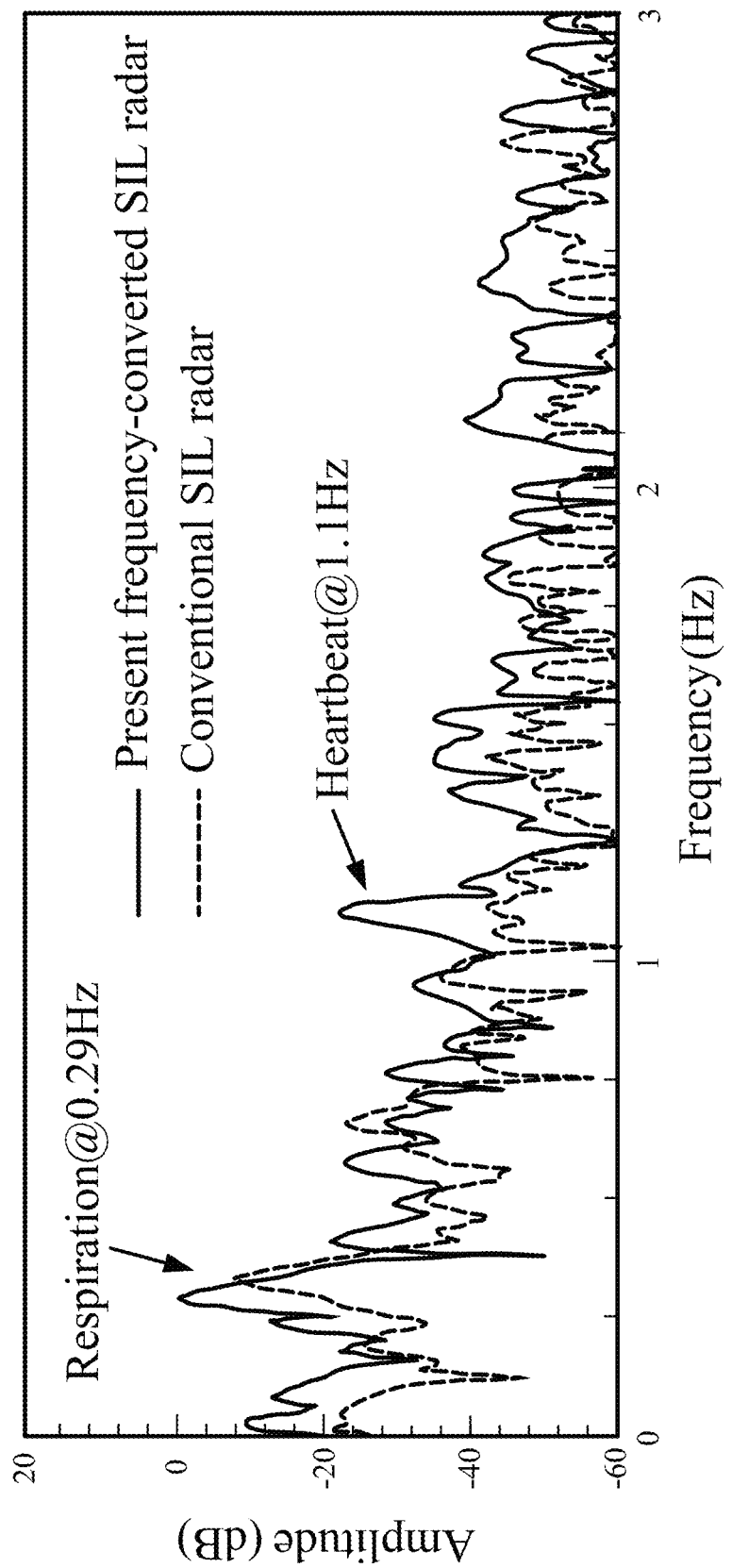
FIG. 7 shows experimental results by using the frequency-converted SIL radar of the first embodiment of the present invention and a conventional SIL radar.

With reference to FIG. 7, it shows experimental results by using the frequency-converted SIL radar 100 of the first embodiment and a conventional SIL radar. The present and conventional SIL radars are used to detect vital signs of a subject behind a 30 cm-thick concrete wall, and the distances from the radars to the wall and the subject are 0.5 m and 1.5 m. The conventional SIL radar has no frequency converter and its oscillation signal and transmitted signal both have a frequency of 5.8 GHz. As shown in FIG. 7, the frequency-converted SIL radar 100 of the present invention has better sensitivity to detect respiration and heartbeat of the subject. Compared to the present SIL radar, the conventional SIL radar can detect the respiration, but not the heartbeat. The results proves that the center frequency down conversion of the oscillation signal $S_O$ by using the frequency converter 120 of the present invention actually can improve the penetration of the transmitted signal $S_T$ and also maintain the high sensitivity to the tiny vibration.

The center frequencies of the oscillation signal $S_O$ and the injection signal $S_{IN}$ are changed by the frequency converter 120 such that the SILO 110 has an oscillation frequency different to that of the transmitted signal $S_T$ and is injection-locked by the injection signal $S_{IN}$. Consequently, the frequency-converted SIL radar 100 of the present invention has both high sensitivity and penetration, or has both high sensitivity and low cost.

The scope of the present invention is only limited by the following claims. Any alternation and modification without departing from the scope and spirit of the present invention will become apparent to those skilled in the art.

What is claimed is:

1. A frequency-converted self-injection-locked radar, comprising:
    a self-injection-locked oscillator (SILO);
    a frequency converter electrically connected to the SILO;
    a transceiver antenna element electrically connected to the frequency converter; and
    a demodulator electrically connected to the SILO; wherein the SILO is configured to generate an oscillation signal, the frequency converter is configured to receive the oscillation signal and convert a center frequency of the oscillation signal, the transceiver antenna element is configured to receive the converted oscillation signal, transmit the converted oscillation signal as a transmitted signal to an object and receive a reflected signal as an injection signal from the object, the frequency converter is configured to receive the injection signal and convert a center frequency of the injection signal, the converted injection signal is configured to be injected into the SILO to lock the SILO in a self-injection-locked state, and the demodulator is configured to receive and demodulate the oscillation signal.

2. The frequency-converted self-injection-locked radar in accordance with claim 1, wherein the frequency converter is configured to down-convert the center frequency of the oscillation signal and up-convert the center frequency of the injection signal.

3. The frequency-converted self-injection-locked radar in accordance with claim 2, wherein the frequency converter includes a local oscillator, a down mixer and an up mixer, the local oscillator is configured to generate a local oscillation signal, the down mixer is electrically connected to the local oscillator and the SILO and configured to mix the local oscillation signal and the oscillation signal such that the center frequency of the oscillation signal is decreased, the up mixer is electrically connected to the local oscillator and the transceiver antenna element and configured to mix the local oscillation signal and the injection signal such that the center frequency of the injection signal is increased.

4. The frequency-converted self-injection-locked radar in accordance with claim 2, wherein the frequency converter includes a frequency divider and a frequency multiplier, the frequency divider is electrically connected to the SILO and configured to decrease the center frequency of the oscillation signal, the frequency multiplier is electrically connected to the transceiver antenna element and configured to increase the center frequency of the injection signal.

5. The frequency-converted self-injection-locked radar in accordance with claim 1, wherein the frequency converter is configured to increase the center frequency of the oscillation signal and decrease the center frequency of the injection signal.

6. The frequency-converted self-injection-locked radar in accordance with claim 5, wherein the frequency converter includes a local oscillator, an up mixer and a down mixer, the local oscillator is configured to generate a local oscillation signal, the up mixer is electrically connected to the local oscillator and the SILO and configured to mix the local oscillation signal and the oscillation signal such that the center frequency of the oscillation signal is increased, the down mixer is electrically connected to the local oscillator and the transceiver antenna element and configured to mix the local oscillation signal and the injection signal such that the center frequency of the injection signal is decreased.

7. The frequency-converted self-injection-locked radar in accordance with claim 5, wherein the frequency converter includes a frequency multiplier and a frequency divider, the frequency multiplier is electrically connected to the SILO and configured to increase the center frequency of the oscillation signal, the frequency divider is electrically connected to the transceiver antenna element and configured to decrease the center frequency of the injection signal.

8. The frequency-converted self-injection-locked radar in accordance with claim 3, wherein the frequency converter further includes a power splitter electrically connected to the local oscillator, the power splitter is configured to receive and divide the local oscillation signal into two divided local oscillation signals, the divided local oscillation signals are configured to be delivered to the down mixer and the up mixer, respectively.

9. The frequency-converted self-injection-locked radar in accordance with claim 6, wherein the frequency converter further includes a power splitter electrically connected to the local oscillator, the power splitter is configured to receive and divide the local oscillation signal into two divided local oscillation signals, the divided local oscillation signals are configured to be delivered to the down mixer and the up mixer, respectively.

10. The frequency-converted self-injection-locked radar in accordance with claim 1, wherein the transceiver antenna element includes a transmitting antenna and a receiving antenna, the transmitting antenna is electrically connected to the frequency converter and configured to receive the oscillation signal and transmit the oscillation signal as the transmitted signal, the receiving antenna is electrically connected to the frequency converter and configured to receive the reflected signal as the injection signal and deliver the injection signal to the frequency converter.

11. The frequency-converted self-injection-locked radar in accordance with claim 1, wherein the demodulator includes a power splitter, a delay line, a first mixer, a second mixer and a processor, the power splitter is electrically connected to the SILO, the delay line is electrically connected to the power splitter, the first and second mixers are electrically connected to the power splitter and the delay line, the processor is electrically connected to the first and second mixers, wherein the power splitter is configured to receive and divide the oscillation signal into two divided oscillation signals, one of the divided oscillation signals is delivered to the first and second mixers and the other divided oscillation signal is delivered to the first and second mixers via the delay line, the first mixer is configured to output a first mixing signal and the second mixer is configured to output a second mixing signal, the processor is configured to receive and process the first and second mixing signals to output a demodulated signal.

* * * * *